(12) United States Patent
Goldenberg

(10) Patent No.: US 6,972,563 B2
(45) Date of Patent: Dec. 6, 2005

(54) METHOD OF ADJUSTING A FLUXGATE MAGNETOMETER APPARATUS

(75) Inventor: Felix Goldenberg, Burnsville, MN (US)

(73) Assignee: Rosemount Aerospace Inc., Burnsville, MN (US)

(*) Notice: Subject to any disclaimer, the term of this patent is extended or adjusted under 35 U.S.C. 154(b) by 0 days.

(21) Appl. No.: 10/793,391

(22) Filed: Mar. 4, 2004

(65) Prior Publication Data

US 2005/0194972 A1 Sep. 8, 2005

(51) Int. Cl.$^7$ .............................................. G01R 33/04
(52) U.S. Cl. ..................................... 324/253; 33/361
(58) Field of Search ..................... 324/244, 253–255, 324/260–262; 33/355 R, 361; 340/870.33

(56) References Cited

U.S. PATENT DOCUMENTS 6,633,160 B2 * 10/2003 How et al. ................... 324/253
2004/0027120 A1 * 2/2004 Rippingale .................. 324/253

OTHER PUBLICATIONS

D.H. Titterton and J.L. Weston, "Strapdown Inertial Navigation Technology", Peter Peregrinus Ltd. On behalf of the Institution of Electrical Engineers, 1997.

R. Noble, "Fluxgate Magnetometry", Electron, Wirel. World, 1991, pp. 726-730.

A Hine, "Magnetic Compasses and Magnetometers", Adam Hilger, 1968.

* cited by examiner

Primary Examiner—Bot LeDynh
(74) Attorney, Agent, or Firm—Peter M. Hernandez, Esq.; Calfee, Halter & Griswold LLP

(57) ABSTRACT

A single-axis, fluxgate magnetometer apparatus comprises: an excitation subassembly comprising a toroidal core wound with a predetermined number of turns of an excitation coil; and a pick up subassembly comprising a coil form including a hollow chamber, and a predetermined number of turns of a pick up coil wound on the coil form about the hollow chamber, the excitation subassembly disposed in the hollow chamber of the coil form and secured in the hollow chamber at a desired position. A method of adjusting the single-axis, fluxgate magnetometer apparatus comprises the steps of: applying an excitation signal to the excitation coil while disposed in the hollow chamber; monitoring a signal waveform of the pick up coil responsive to the excited excitation coil; adjusting the position of the excitation subassembly in the hollow chamber to effect a desired signal waveform of the pick up coil; and securing the excitation subassembly in the hollow chamber at the position that provides the desired signal waveform.

10 Claims, 7 Drawing Sheets

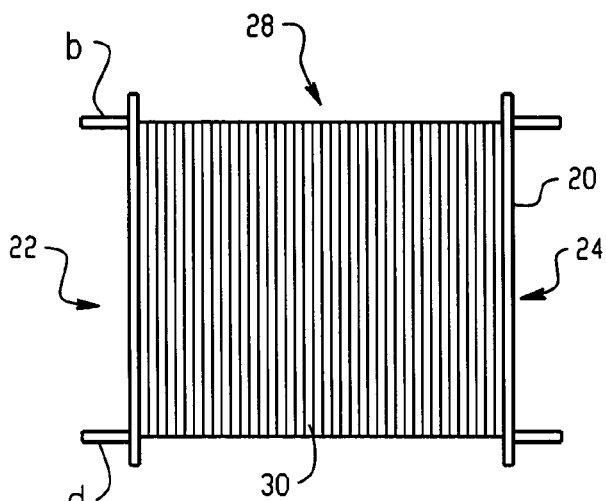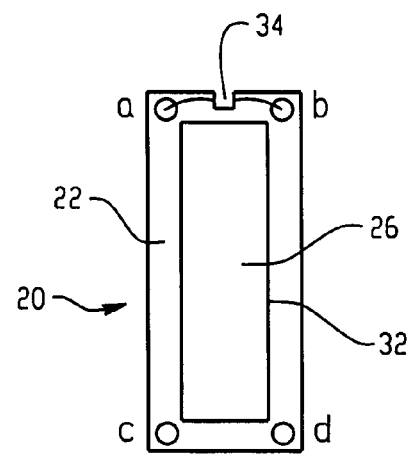
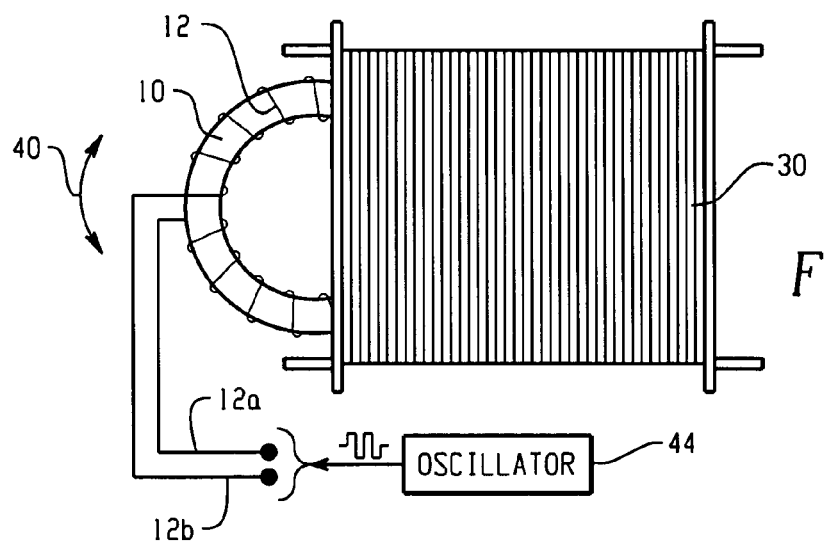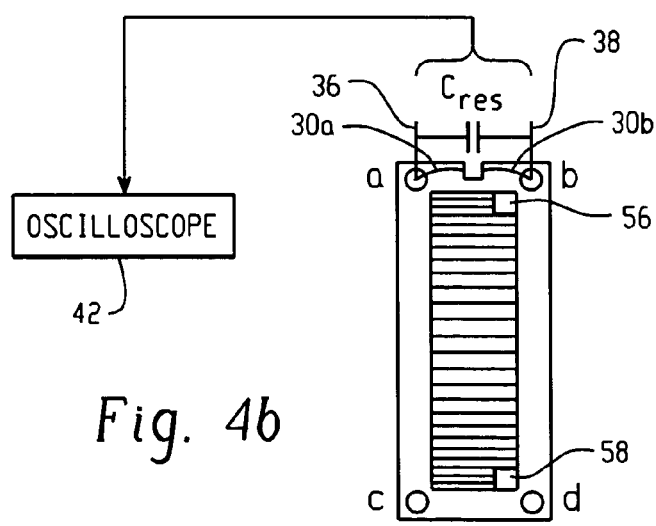

METHOD OF ADJUSTING A FLUXGATE MAGNETOMETER APPARATUS

BACKGROUND OF THE INVENTION

The present invention relates generally to magnetometers, and more particularly to fluxgate magnetometer apparatus and method of adjusting same.

In general, fluxgate magnetometers are used as a heading reference, or an attitude gyro drift reference in inertial navigation systems for aircraft, land vehicles, ships, underwater vehicles and the like. A fluxgate magnetometer usually comprises three fluxgate sensing elements Mx, My and Mz packaged mutually orthogonal to each other as shown in the diagram of FIG. 1. A magnetometer for use in a strapdown inertial navigation system (INS) has its axes aligned with the principle axes X, Y and Z of the aircraft or vehicle on which it is mounted. This configuration enables the attitude of such aircraft or vehicle to be determined with respect to the Earth's magnetic Field (EMF) vector T (see FIG. 1).

In the diagram of FIG. 1, a vectors H and η are representative respectively of the horizontal and vertical components of the EMF vector T, the vector g is representative of the force of gravity, the symbol I is representative of an angle of magnetic inclination between the vectors T and H, the Greek symbols ψ, ν, and γ are representative of the magnetic heading, the aircraft/magnetometer pitch and the aircraft/magnetometer roll, respectively. A magnetometer alone can not provide an unequivocal measurement of an aircraft attitude. Measurements made with a magnetometer for strapdown INS applications define an angle between the EMF vector T and a particular axis of the magnetometer. However, this magnetometer axis may lie anywhere on the surface of an imaginary cone of a semi-angle equal to that angle about the vector T. Accordingly, an additional measurement is desired to determine attitude with respect to another reference, such as the gravity vector g.

Since attitude (pitch and roll) is known or measurable, the magnetic heading ψ may be calculated using the following expression:

$$\psi = \arctan[(-Z \sin \gamma - Y \cos \gamma)/(X \cos \nu - Z \cos \gamma \sin \nu + Y \sin \gamma \sin \nu)]; \quad (1)$$

where: X, Y and Z are the three axis strapdown magnetometer measurements (Mx, My, and Mz) which correspond to projections of vector T on the corresponding magnetometer axes. Equation (1) illustrates that to provide highly accurate heading information, the measurements of attitude (pitch and roll) and the magnetometer measurements of the projections of the EMF vector need to be highly accurate.

Typically, a fluxgate magnetometer sensor comprises a sensor assembly and sensor signal conditioning electronics. The sensor assembly usually includes a toroidal core of high magnetic permeability 10 (see FIG. 2a) which is wound with a wire coil 12 uniformly around the perimeter thereof for a predetermined number of turns (see FIG. 2b). Wire coil 12 once wound about the core 10 becomes the excitation coil of the sensor assembly. Thereafter, a second or pick up coil 14 is would about the excitation coil in order to measure the EMF projection on one axis, such as the X-axis (see FIG. 2c). The pick up coil 14 is wound transverse to the axis of measurement. If additional measurements are desired, say for the Y and Z axes, for example, then additional pick up coils may be wound about the excitation coil 12. For example, for a Y-axis measurement, a pick up coil 16 is wound transverse to the Y-axis (see FIG. 2d) and likewise, for a Z-axis measurement, a pick up coil 18 is wound transverse to the Z-axis (into the page), refer to FIG. 2e.

After the winding process is completed, several coats of varnish, for example, are applied to the sensor assembly to hold the windings in place. The excitation coil leads may be connected to an excitation circuit in the sensor electronics which may apply an excitation signal at a predetermined frequency f and waveform, which may be a square waveform at 4.5 kHz, for example. Leads of each of the pick up coils may be connected to a corresponding signal conditioning circuit which may produce a DC voltage output U that is proportional to the corresponding magnetometer axis measurement. Each output U may be defined by the following expression:

$$U = K(U_{2f} \cos \phi + U_q \sin \phi); \quad (2)$$

where: $U_{2f}$ and $U_q$ represent a second harmonic signal and its quadrature component, respectively, generated from the corresponding sensor pick up coil as a measure of the axis magnetic field, φ represents a phase angle shift between the phases of signal $U_{2f}$ and the excitation signal, and K is a phase gain term of the sensor electronics.

The sensor electronics operate to adjust the phase shift φ to substantially zero in order to provide the resultant magnetic axis measurement U with little or no quadrature component influence. However, due to a significant variation in ambient temperature on the magnetometer assembly, which may be from −55° C. to +85° C., for example, certain resistance and capacitance values of the assembly drift affecting the phase shift adjustment and causing an undesirable error influence of $U_q \sin \phi$ on the magnetic field measurement U. To minimize the consequences of the temperature variation on the measurement, the quadrature component $U_q$ should be kept as low as possible.

The magnitude of the quadrature component is highly dependent on several mechanical design factors in the magnetometer assembly, like having the separate sections of pick up coil windings be identically and symmetrically distributed over the excitation coils, for example, which is not an easy task. As noted above, after the process of coil winding is completed, the entire sensor assembly is essentially encapsulated with varnish or other encapsulating material. This results in a completed sensor assembly with no mechanical adjustment capability. So, if the quadrature component of the measurement signal U is found to exceed an acceptable level, the resultant sensor assembly will be scrapped. This drawback is compounded for multi-axis sensing assemblies having two or more pick up coils wound over one core (see FIGS. 2d and 2e).

The present invention provides a fluxgate magnetometer sensor assembly design which overcomes the foregoing described drawbacks of the present design and allows for mechanical adjustment to minimize the undesirable quadrature component of the magnetic measurement which should improve the yield of sensor assemblies in the manufacturing process.

SUMMARY OF THE INVENTION

In accordance with one aspect of the present invention, a single-axis, fluxgate magnetometer apparatus comprises: an excitation subassembly comprising a toroidal core wound with a predetermined number of turns of an excitation coil; and a pick up subassembly comprising a coil form including a hollow chamber, and a predetermined number of turns of a pick up coil wound on the coil form about the hollow chamber, the excitation subassembly disposed in the hollow chamber of the coil form and secured in the hollow chamber at a desired position.

In accordance with another aspect of the present invention, a method of adjusting a single-axis, fluxgate magnetometer apparatus comprises the steps of: winding a toroidal core with a predetermined number of turns of an excitation coil to form an excitation subassembly; winding a coil form with a predetermined number of turns of a pick up coil around a hollow chamber thereof to form a pick up subassembly; disposing the excitation subassembly into the hollow chamber of the coil form; applying an excitation signal to the excitation coil while disposed in the hollow chamber; monitoring a signal waveform of the pick up coil responsive to the excited excitation coil; adjusting the position of the excitation subassembly in the hollow chamber to effect a desired signal waveform of the pick up coil; and securing the excitation subassembly in the hollow chamber at the position that provides the desired signal waveform.

BRIEF DESCRIPTION OF THE DRAWINGS

FIGS. 3a and 3b are side and profile views, respectively, of an exemplary pick up coil assembly suitable for use in an embodiment of the present invention.

FIGS. 4a and 4b are side and profile views, respectively, of a single axis magnetometer sensor assembly suitable for embodying one aspect of the present invention.

DETAILED DESCRIPTION OF THE INVENTION

Figure 1:
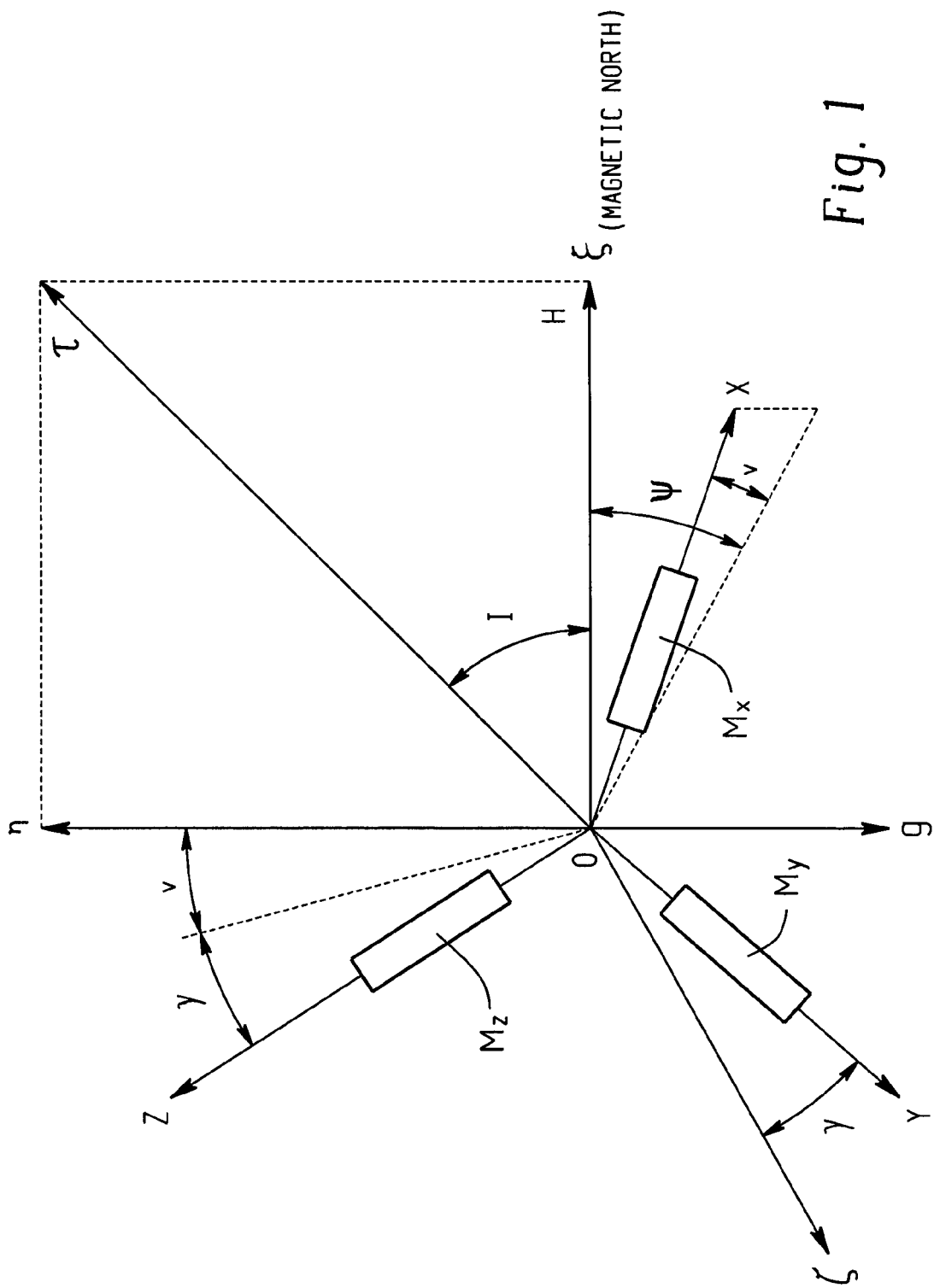
FIG. 1 is a graph illustrating three dimensional magnetometer sensing elements and attitude vectors of a moving vehicle with respect to the Earth's magnetic field vector.
Figure 2A:
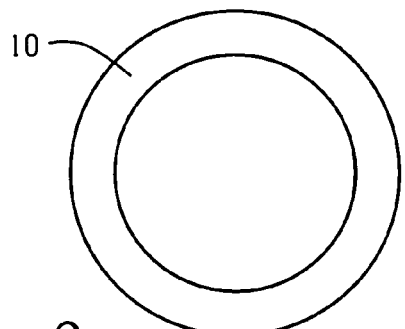
FIGS. 2a through 2e are illustrations of a sensor assembly currently being used for magnetometer applications.
Figure 2B:
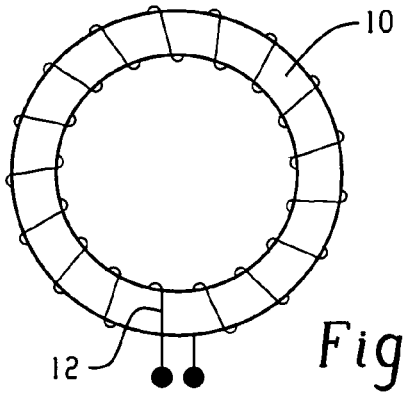
Figure 2C:
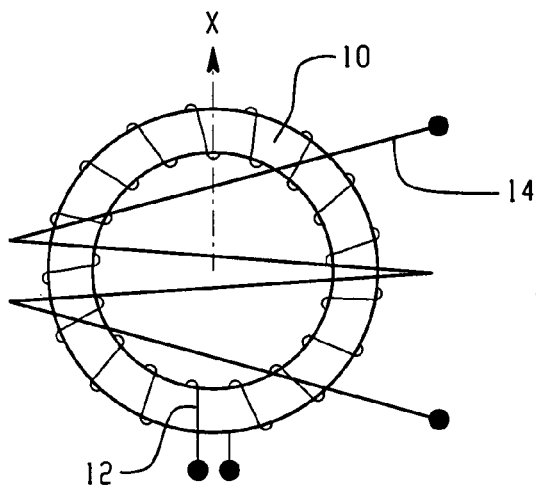
Figure 2D:
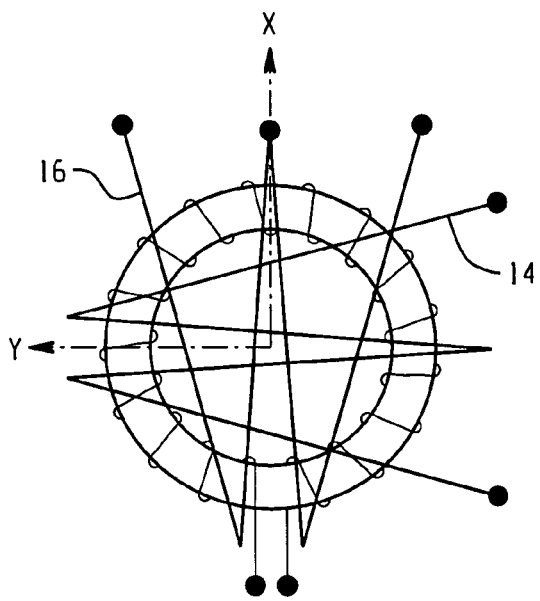
Figure 2E:
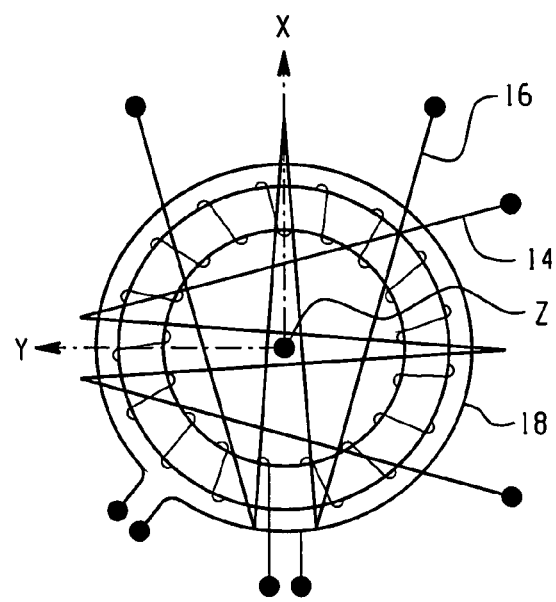

A single-axis, magnetometer sensor assembly in accordance with one aspect of the present invention includes two individual subassemblies. A first subassembly comprises an excitation coil 12 wound about a high magnetic permeability toroidal core 10 as shown in FIG. 2b. A predetermined number of coil turns are symmetrically distributed around the circumference of the core 10. A second subassembly comprises a coil form 20 as shown in side and profile views in FIGS. 3a and 3b, respectively. In the present embodiment, the coil form 20 is a parallelepiped shell of special non-magnetic plastic material having a front side 22, a back side 24 and a parallelepiped hollow chamber portion 26 which is shown in the view of FIG. 3b. The front 22 and back 24 sides are of a larger cross section than a center portion 28 (see FIG. 3a) of the coil form shell 20 to form a raised lip around the periphery of the center portion 28 at both the front and back sides, 22 and 24, respectively.

A pick up coil 30 is wound a predetermined number of turns about the center portion 28. The pick up coil windings 30 are held in place within the center portion 28 by the front side and back side lips. The front side 22 includes a rectangular window opening 32 to the chamber portion 26 and the back side 24 encloses the chamber portion 26. The window 32 and chamber 26 are dimensioned to permit the excitation coil wound toroidal core subassembly to be slid through window 32 into the chamber 26 and fit snugly therein as shown in FIGS. 4a and 4b. An isometric view of an assembled sensor assembly embodiment is shown in FIG. 5.

In the present embodiment, the front side 22 of the coil form shell 20 includes four electrical connection pin terminals a, b, c and d disposed thereon. Pins a and b are disposed respectively at the top corners of the front side 22, and pins c and d are disposed respectively at the bottom corners of the front side 22 as shown in FIG. 3b. Leads 30a and 30b from the pick up coil 30 are brought from the center portion 28 through a notch 34 in the top of front side 22 and connected respectively to the terminal pins a and b, preferably by soldering (see FIGS. 4b and 5). Leads 36 and 38 may provide external electrical connections to the pick up coil 30 via the terminal pins a and b, respectively (see FIG. 5). For testing purposes, leads 12a and 12b from the excitation coil 12 may be left unconnected from the terminal pins c and d (see FIG. 5).

Figure 5:
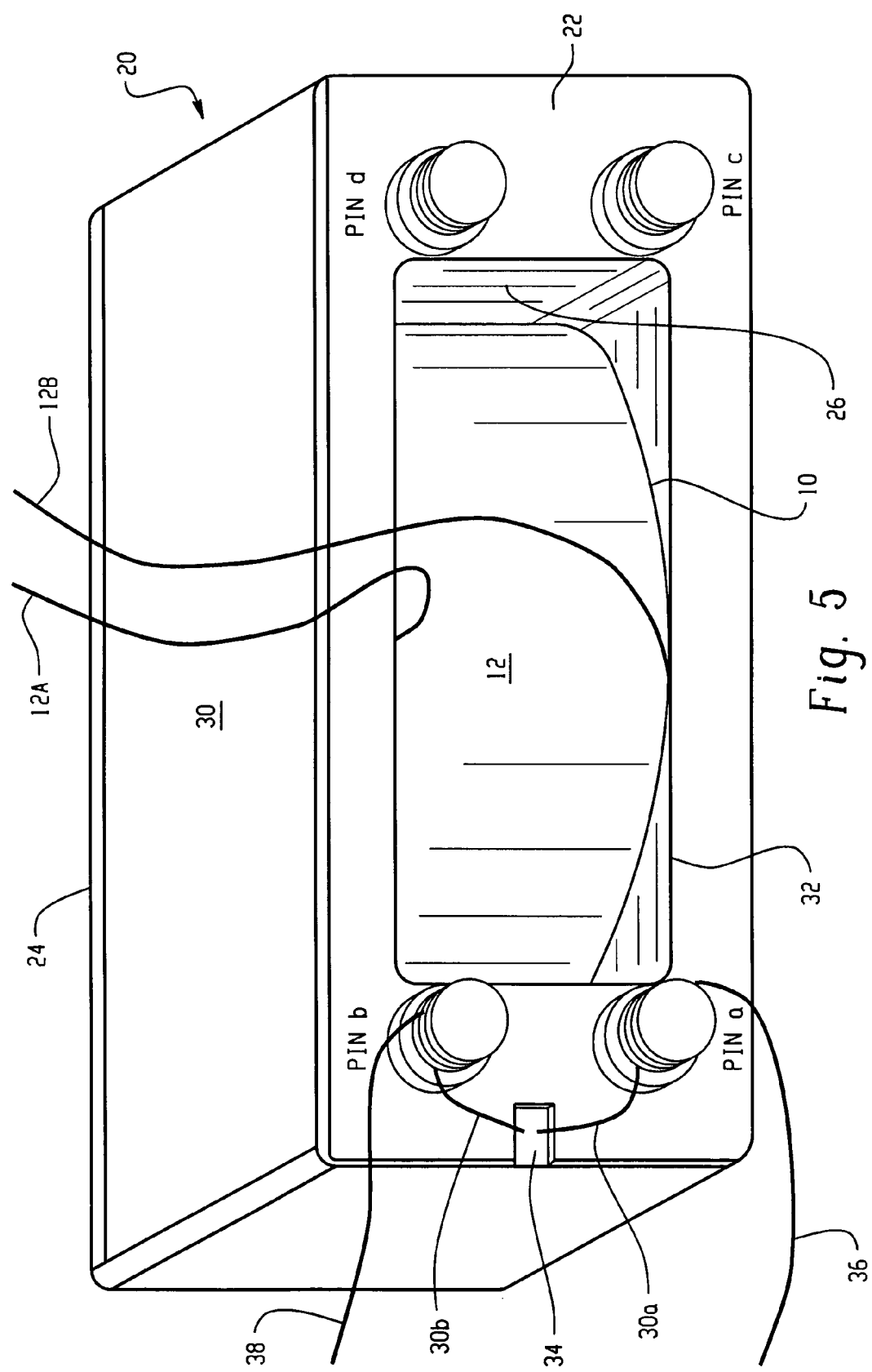
FIG. 5 is an isometric view of the single axis magnetometer assembly embodiment of FIGS. 4a and 4b shown resting on its side.

Once the excitation coil subassembly is slid into the chamber 26 as shown in FIG. 5, the sensor assembly is ready to be adjusted to minimize the quadrature component $U_q$ by orienting the excitation coil subassembly within chamber 26 with respect to the pick up coil 30. In the present embodiment, this may be accomplished by a rotation of the excitation coil subassembly while in chamber 26 as shown by the arrowed line 40 in FIG. 4a. The adjustment process commences with connecting the pick up coil 30 to an oscilloscope 42 via leads 36 and 38 (see FIG. 4b) and connecting the excitation coil 12 to an oscillator circuit 44 via leads 12a and 12b (see FIG. 4a). A resonant capacitor Cres may be connected across leads 36 and 38 in parallel with the pick up coil 30.

Figure 6:
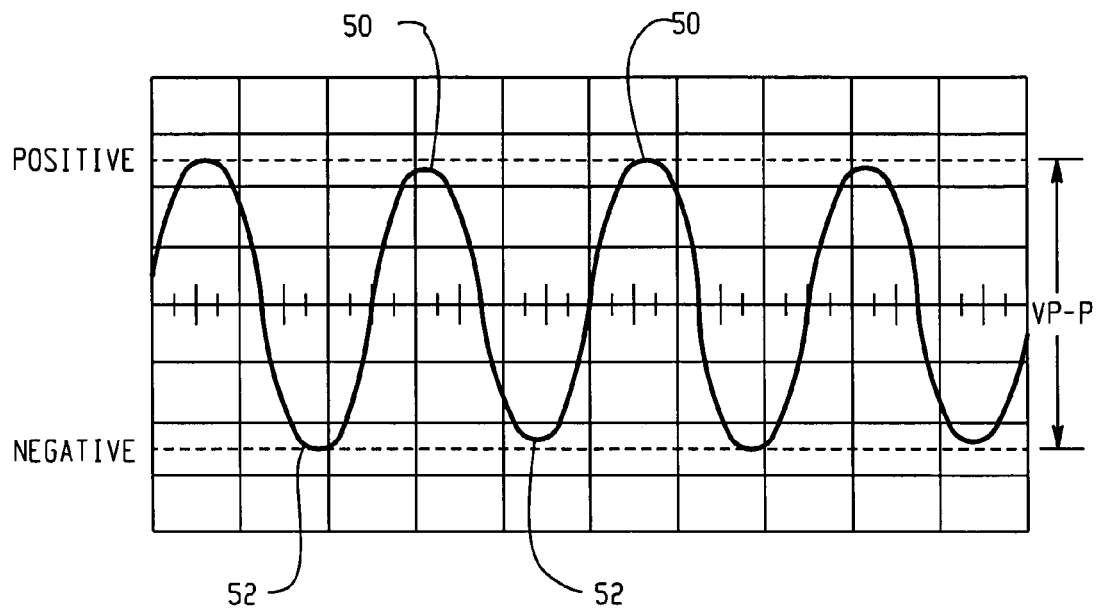
FIGS. 6 and 7 are exemplary pick up coil waveforms which may be viewed on a screen of an oscilloscope during adjustment of the single axis magnetometer embodiment of FIG. 5.
Figure 7:
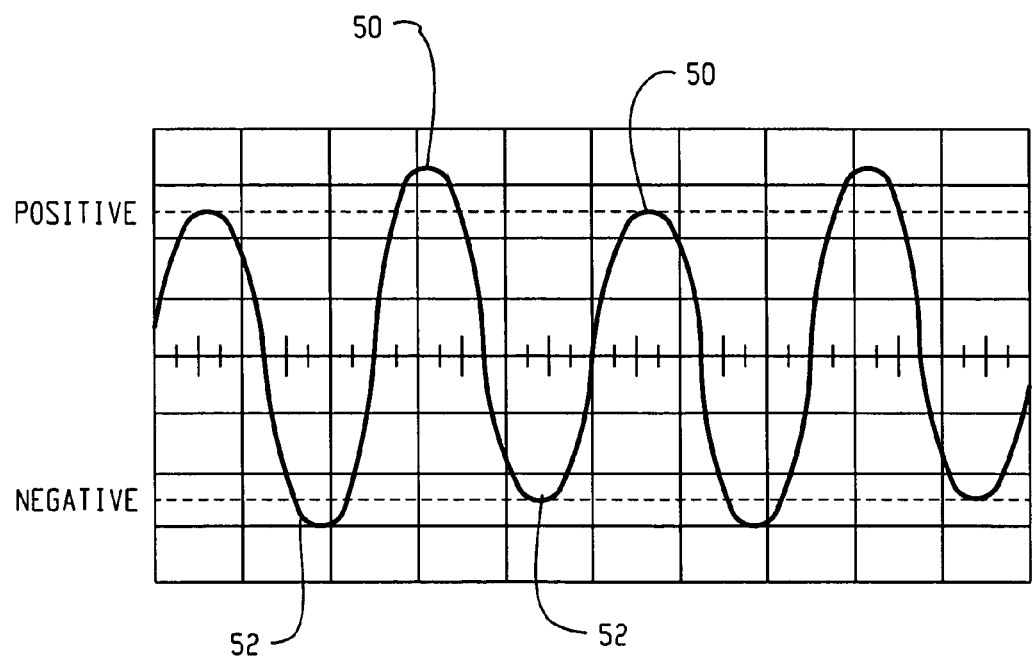

Next, the excitation circuit 44 is powered and adjusted to generate an excitation signal for the excitation coil 12. The excitation signal may be a square wave at approximately 4.5 kHz, for example. The oscilloscope 42 is powered to view the voltage potential of the resultant pick up signal on a screen thereof. In the present example, the resultant pick up voltage signal is of a sinusoidal waveform. During the adjustment process, the coil form 20 may be vertically disposed, with the front side 22 facing upward, and held in a stable or stationary position. With the sensor assembly is in this orientation, the excitation core subassembly inside of chamber 26 may be rotated while viewing the waveform displayed on the screen of the oscilloscope 42. If the adjacent positive (50) and negative (52) peaks of the resultant pick up voltage waveform are not equal in amplitude as shown in the exemplary screen view of FIG. 7, then, the excitation coil subassembly is rotated to render the adjacent positive (50) and negative (52) peaks of the resultant pick up voltage waveform substantially equal as shown in the exemplary screen view of FIG. 6.

Thereafter, without altering the position of the excitation coil subassembly, the coil form 20 may be disposed in a horizontal position with pins a and c at the bottom and pins b and d at the top as shown in FIG. 5. While maintaining this horizontal orientation, the entire sensor assembly may be rotated until the peak to peak amplitudes of the sinusoidal waveform appearing on the oscilloscope screen are at a minimum. At this point, the orientation of the front or terminal side 22 of the sensor assembly should be approximately 90° (i.e. perpendicular) to magnetic North. While maintaining the sensor assembly at this minimum peak to peak orientation, the excitation coil subassembly, which should be completely within chamber 26, is rotated clockwise or counter-clockwise inside chamber 26 until the oscilloscope voltage waveform is reduced to the smallest obtainable peak to peak amplitude value. The resultant measured peak to peak value should not exceed a predetermined minimum peak to peak value.

Thereafter, the maximum peak to peak value of the oscilloscope waveform may be determined by repositioning the sensor assembly to an angle of approximately 45° to the horizontal with the terminal or front side 22 directed upward, and while in this orientation, rotating the sensor assembly until the non-terminal or back side 24 of the sensor assembly points toward magnetic North. While observing the oscilloscope voltage waveform, the sensor assembly is moved slightly to the left and to the right and up and down to find the maximum peak to peak value which should be at least a predetermined maximum peak to peak value.

Figure 8:
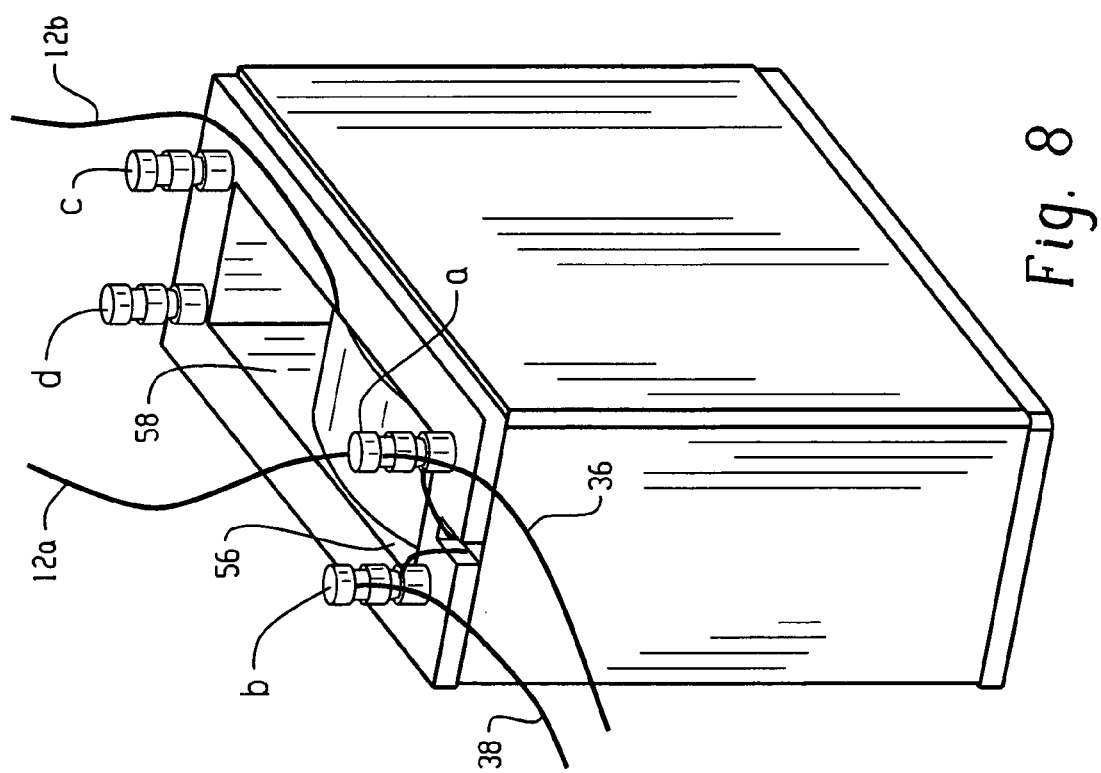
FIG. 8 is an isometric view of the single axis magnetometer assembly embodiment of FIGS. 4a and 4b shown resting top side up.

Thereafter, the sensor assembly should be moved back to the minimum peak to peak value position noted above, and it should be verified that the minimum peak to peak voltage measured at this position has not changed substantially. The sensor assembly may be re-adjusted if the measured peak to peak voltage exceeds the predetermined minimum peak to peak value. Once the sensor assembly is adjusted to the point in which the output voltage of the pick up coil has adjacent positive and negative peak amplitudes that are approximately equal, and has minimum and maximum peak to peak values that are at acceptable levels, then the excitation coil subassembly is secured in position within the chamber 26 of the coil form subassembly 20. This may be accomplished by applying an epoxy adhesive to certain tacking points where the excitation coil subassembly is juxtaposed with the sides of the chamber 26. Two such tacking points are shown at 56 and 58 in FIG. 4b and FIG. 8.

Figure 9:
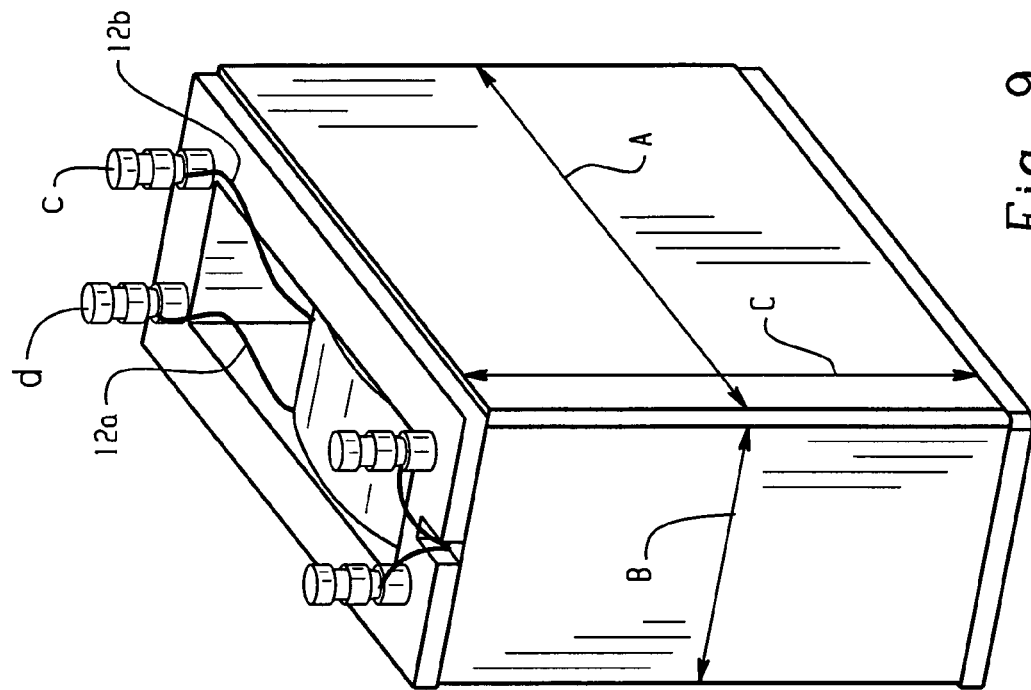
FIG. 9 is an isometric view of the single axis magnetometer assembly embodiment of FIGS. 4a and 4b showing a final assembly version.

Once the epoxy adhesive is cured at the tacking points 56 and 58, leads 12a and 12b from the excitation coil 12 may be cut to length and attached, preferably by soldering, to pins d and c, respectively, and wires 36 and 38 may be removed from pins a and b shown in FIG. 9. Thereafter, an epoxy material may be used to cover the excitation coil subassembly in the chamber 26 of the coil form 20 and left to cure. Then, the terminal side 22 and non-terminal side 24 of the coil form may be encapsulated with the epoxy material and left to cure one side at a time. The encapsulating epoxy material should not be permitted to extend beyond the edge dimensions of the coil form shell 20.

The resultant final sensor assembly embodiment is shown in FIG. 9. For the present example, the external A, B and C dimensions are approximately 0.495 in., 0.150 in. and 0.417 in, respectively, and the internal or chamber A, B and C dimensions are approximately 0.415 in., 0.120 in., and 0.400 in., respectively. The raised lip around the periphery of the center portion of the front side 22 and back side 24 is approximately 0.03 in.

Figure 10:
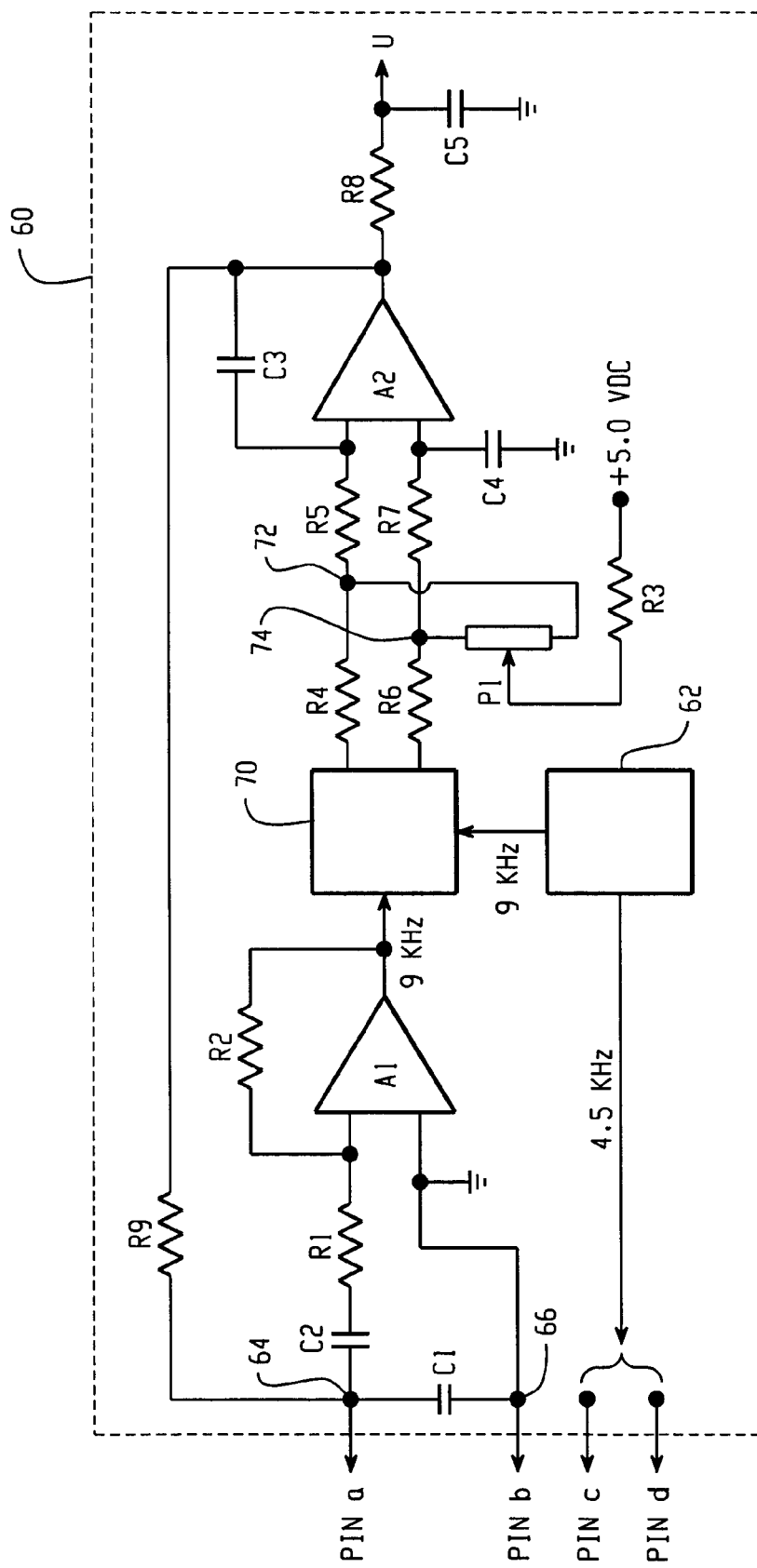
FIG. 10 is a circuit schematic of exemplary sensor conditioning electronics for use with the magnetometer sensor assembly embodiment of FIG. 9.

FIG. 10 is a circuit schematic of exemplary sensor electronics 60 suitable for operating the sensor assembly embodiment described herein above. Referring to FIG. 10, an oscillator circuit 62 is coupled to the excitation coil 12 via pins c (lead 12b) and d (lead 12a). Circuit nodes 64 and 66 are coupled to the pick up coil 30 via pins a (lead 30a) and b (lead 30b), respectively. Across nodes 64 and 66 is coupled a resonant capacitor C1. Node 64 is coupled to one input of an amplifier circuit A1 though a series combination of capacitor C2 and resistor R1. Node 62 is coupled to another input of amplifier A1 which is connected to a common or ground potential. Coupled between the output and one input of A1 is another resistor R2. The output of A1 is coupled to one input of a phase sensitive detector (PSD) circuit 70 and an output of the excitation circuit 62 is coupled to another input thereof.

One output of the PSD circuit 70 is coupled through a series connected pair of resistors R4 and R5 to one input of an amplifier circuit A2. Another output of the PSD circuit 70 is coupled through a series connected pair of resistors R6 and R7 to another input of A2 which is coupled to ground potential through a capacitor C4. The connecting node 72 between resistors R4 and R5 is connected to one end of a potentiometer P1. The other end of P1 is connected to the connecting node 74 between resistors R6 and R7 and the adjustment arm of P1 is connected to a voltage supply which may be +5 VDC, for example, through a resistor R3. Coupled between the output and one input of A2 is a capacitor C3. The output of A2 is filtered by a series combination of resistor R8 and capacitor C5 to produce the desired axis measurement signal U. The output of A2 is also fed back to the input node 64 through a resistor R9.

In operation, the excitation circuit 62 generates an excitation signal, which may be a square wave at 4.5 kHz, for example, to drive the excitation coil 12 to create an AC excitation magnetic field in the core of the sensor assembly. The external (measured) magnetic field causes the pick up coil 30 to generate a voltage potential signal across nodes 64 and 66 at a second harmonic of the frequency of the excitation signal or 9 kHz. The resonant capacitor C1 shapes the voltage signal into a sinusoidal waveform. If the sensor assembly is oriented properly with respect to the desired axis of EMF projection, the voltage signal from the pick up coil 30 will include the desired single axis measurement of the magnetometer. The amplifier circuit A1 amplifies the voltage signal and provides it to the PSD circuit 70. A second harmonic signal in phase with the excitation signal is generated by the excitation circuit 62 and provided to the PSD circuit 70. The PSD circuit 70 produces a DC signal that is proportional to the product of the aforementioned two signals provided thereto. This DC signal drives the integrator circuit comprising amplifier A2.

The amplifier A2 provides a feedback signal to node 64 via resistor R9 to null the second harmonic signal created by the magnetic field presence and reduce the DC signal output from the PSD circuit 70 to substantially zero. When the output of the PSD circuit 70 is at substantially zero, the output of the integrator circuit or A2 is at a DC voltage potential that is representative of the magnetic field component applied to the pick up coil 30. The potentiometer P1 may be used to adjust the output of A2 to be at a proper DC voltage potential for zero input at steady state conditions and room temperature, for example. The filter R8–C5 provides further filtering of any voltage ripple that may be riding on the DC output signal of A2. The resultant DC voltage potential will be representative of the desired single axis magnetometer measurement U with the undesirable quadrature error component adjusted to a minimum. For multi-axis magnetometer applications, a sensor assembly (properly oriented) and sensor electronics combination may be used for each axis of the application.

While the various aspects of the present invention have been described herein above in connection with one or more embodiments, it is understood that the various embodiments were presented by way of example with no intention of limiting the present invention in any way. Accordingly, the present invention should not be limited to by the embodiments presented above, but rather construed in breadth and broad scope in accordance with the recitation of the claims appended hereto.

What is claimed is:

1. Method of adjusting a single-axis, fluxgate magnetometer apparatus, said method comprising the steps of:
    winding a toroidal core with a predetermined number of turns of an excitation coil to form an excitation subassembly;
    winding a coil form with a predetermined number of turns of a pick up coil around a hollow chamber thereof to form a pick up subassembly;
    disposing said excitation subassembly into said hollow chamber of said coil form;
    applying an excitation signal to said excitation coil while disposed in said hollow chamber;
    monitoring a signal waveform of the pick up coil responsive to said excited excitation coil;
    adjusting the position of the excitation subassembly in said hollow chamber to effect a desired signal waveform of the pick up coil; and
    securing the excitation subassembly in said hollow chamber at said position that provides said desired signal waveform.

2. The method of claim 1 wherein the responsive signal waveform of the pick up coil being monitored is substantially periodic with adjacent peak amplitudes; and wherein the position of the excitation subassembly is adjusted until adjacent peak amplitudes of the periodic waveform are substantially equal.

3. The method of claim 2 wherein the step of adjusting includes rotating the excitation subassembly in the hollow chamber of the pick up subassembly.

4. The method of claim 2 including the steps of:
    disposing the pick up subassembly in a horizontal orientation;
    rotating the pick up subassembly in the horizontal orientation until peak to peak amplitudes of the periodic waveform are at a minimum value; and
    thereafter, rotating the excitation subassembly in the hollow chamber to effect a minimum peak to peak amplitude value of the periodic waveform.

5. The method of claim 4 including the step of accepting the magnetometer apparatus if the effected minimum peak to peak amplitude value does not exceed a predetermined minimum value.

6. The method of claim 2 including the steps of:
    disposing the pick up subassembly in an orientation approximately forty-five degrees to a horizontal plane; and
    changing the position of the pick up subassembly from said forty-five degree orientation to find a maximum peak to peak amplitude value of the periodic waveform.

7. The method of claim 6 including the step of accepting the magnetometer apparatus if the maximum peak to peak amplitude value is not below a predetermined maximum value.

8. The method of claim 1 wherein the responsive signal waveform of the pick up coil being monitored is substantially sinusoidal with adjacent peak amplitudes; and wherein the position of the excitation subassembly is adjusted until adjacent peak amplitudes of the sinusoidal waveform are substantially equal.

9. The method of claim 1 wherein the step of applying includes the steps of:
    connecting the excitation coil to an excitation circuit; and
    adjusting the excitation circuit to apply a signal of a predetermined frequency and waveform to the excitation coil.

10. The method of claim 1 wherein the step of monitoring includes the steps of:
    connecting the pick up coil to an oscilloscope; and
    viewing a screen of the oscilloscope to monitor the signal waveform of the pick up coil.

* * * * *